(12) United States Patent
Lu

(10) Patent No.: US 12,195,487 B2
(45) Date of Patent: Jan. 14, 2025

(54) ORGANOMETALLIC TIN COMPOUNDS AS EUV PHOTORESIST

(71) Applicant: Feng Lu, Irvine, CA (US)

(72) Inventor: Feng Lu, Irvine, CA (US)

( * ) Notice: Subject to any disclaimer, the term of this patent is extended or adjusted under 35 U.S.C. 154(b) by 208 days.

(21) Appl. No.: 17/981,433

(22) Filed: Nov. 6, 2022

(65) Prior Publication Data

US 2023/0312619 A1 Oct. 5, 2023

Related U.S. Application Data

(63) Continuation of application No. 17/891,134, filed on Aug. 19, 2022, now Pat. No. 11,827,659.

(60) Provisional application No. 63/326,214, filed on Mar. 31, 2022.

(51) Int. Cl.
*C07F 7/22* (2006.01)

(52) U.S. Cl.
CPC .......... *C07F 7/2224* (2013.01); *C07F 7/2284* (2013.01)

(58) Field of Classification Search
CPC ................................ C07F 7/2224; C07F 17/00
See application file for complete search history.

(56) References Cited

U.S. PATENT DOCUMENTS

| 11,827,659 B2 * | 11/2023 | Lu | .......................... G03F 7/0042 |
| 2024/0002412 A1 * | 1/2024 | Ermert | ................... C07F 7/2224 |
| 2024/0134275 A1 * | 4/2024 | Lu | .......................... G03F 7/0044 |

FOREIGN PATENT DOCUMENTS

KR 2020018079 A * 2/2020 ............ C07F 7/2224

OTHER PUBLICATIONS

P. Harrison et al., Journal of the American Chemical Society, 6885-6886 (1969) (Year: 1969).*
H. Albert et al., 60 Journal of Organometallic Chemistry, C1-C6 (1973) (Year: 1973).*
CAS Abstract and Indexed Compounds, R. Namkoong et al. KR 2020018079 (2020) (Year: 2020).*

* cited by examiner

*Primary Examiner* — Alexander R Pagano

(57) ABSTRACT

The present disclosure is related to organometallic sandwich and half-sandwich tin (bearing $\eta^5$-$C_5$—Sn $\pi$ bond) compounds as extreme ultraviolet (EUV) photoresist. Organometallic half-sandwich ($\eta^5$-cyclopentadienyl) tin hydroxide oxide represented by the chemical formula ($\eta^5$-$C_5R_5$)SnO(OH) is described including the methods for preparation and purification, wherein R is H, an alkyl, alkenyl, alkynyl, or cycloalkyl group with 1 to 20 carbon atoms, or an aryl group with 6-20 carbon atoms. Cyclopentadienyl comprises ($C_5H_5$), or substituted $\eta^5$-cyclopentadienyl $\eta^5$-$C_5H_4R$, $\eta^5$-$C_5H_3R_2$, $\eta^5$-$C_5H_2R_3$, $\eta^5$-$C_5HR_4$, and or $\eta^5$-$C_5R_5$. The solution compositions of organometallic sandwich and half-sandwich tin (bearing $\eta^5$-$C_5$—Sn $\pi$ bond) compounds are suitable for EUV photoresists, and/or as the precursors of EUV photoresists for radiation sensitive coating and forming nanoscale patterns through photolithography.

3 Claims, 1 Drawing Sheet

Chemical Formulas
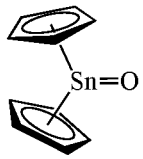
FIG. 1
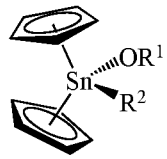
FIG. 2
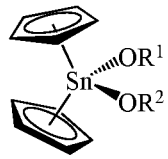
FIG. 3
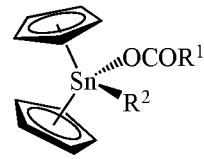
FIG. 4
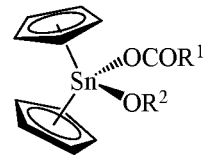
FIG. 5
FIG. 6
FIG. 7
FIG. 8
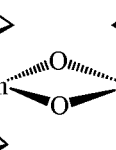
FIG. 9
FIG. 10
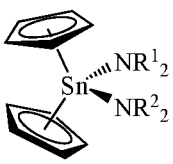
FIG. 11
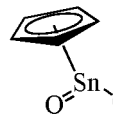
FIG. 12
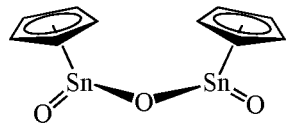
FIG. 13
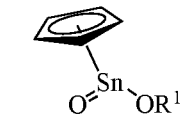
FIG. 14
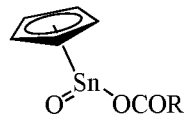
FIG. 15
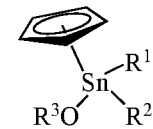
FIG. 16
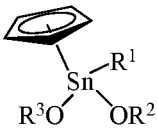
FIG. 17
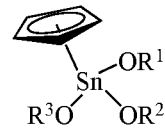
FIG. 18
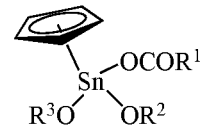
FIG. 19
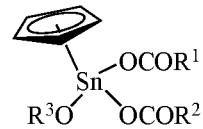
FIG. 20
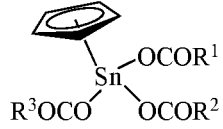
FIG. 21
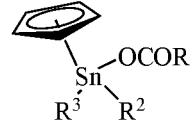
FIG. 22
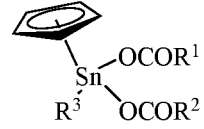
FIG. 23
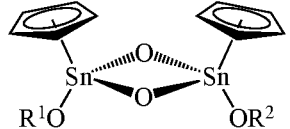
FIG. 24
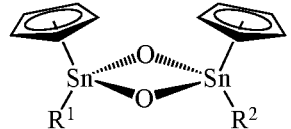
FIG. 25
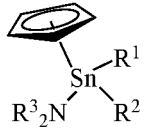
FIG. 26
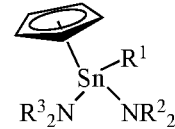
FIG. 27
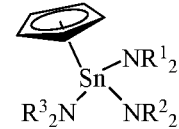

ORGANOMETALLIC TIN COMPOUNDS AS EUV PHOTORESIST

CROSS REFERENCE TO RELATED APPLICATIONS

This application is a continuation-in-part of U.S. patent application Ser. No. 17/891,134, filed on Aug. 19, 2022 to Lu, entitled "Organometallic Tin Compounds as EUV Photoresist", now U.S. Pat. No. 11,827,659 B2, and which claims priority to U.S. provisional patent application No. 63/326,214 filed on Mar. 31, 2022 to Lu, entitled "Organometallic Tin Compounds as EUV Photoresist", all of which are incorporated herein by reference.

FIELD OF THE INVENTION

The present invention relates to organometallic sandwich and half-sandwich tin (bearing $\eta^5$-$C_5$—Sn $\pi$ bond) compounds as EUV photoresists, and/or the precursor for EUV photolithography.

BACKGROUND OF THE INVENTION

With the development of the semiconductor industry, nanoscale patterns have been in pursuit of higher devices density, higher performance, and lower costs. Reducing semiconductor feature size has become a grand challenge. Photolithography has been applied for creating microelectronic patterns over decades. Extreme ultraviolet (EUV) lithography is under development for mass production of smaller semiconductor devices feature size and increasement of devise density on a semiconductor wafer. EUV lithography is a pattern-forming technology using wavelength of 13.5 nm as an exposure light source to manufacture high-performance integrated circuits containing high-density structures patterned with nanometer scale. The application of EUV lithography can make extremely fine pattern with smaller width as equal to or less than 7 nm. Therefore, EUV lithography becomes one significant tool and technology for manufacturing next generation semiconductor devices.

In order to improve EUV lithography for smaller level, wafer exposure throughput can be improved through increased exposure power or increased photoresist sensitivity. Photoresists are radiation sensitive materials upon irradiation with relevant chemical transformation occurs in the exposed region, which would result in different solubility in developer solution between the exposed and non-exposed regions. The properties of EUV photoresist such as resolution, sensitivity, line edge roughness (LER), line width roughness (LWR), etch resistance and ability to form thinner layer are important in photolithography.

Organometallic compounds have high EUV light adsorption because metals have high adsorption capacity of EUV radiation, and then can be used as photoresists and/or the precursors of metal oxides for photolithography at smaller level (e.g. <7 nm), which is of great interests for EUV radiation lithography. As promising advanced materials, organometallic tin compounds can provide photoresist patterning with significant advantages such as improved resolution, sensitivity, etch resistance, and lower line width/edge roughness without pattern collapse because of strong EUV radiation adsorption of tin, which have been demonstrated.

SUMMARY OF THE INVENTION

In a first aspect, the present invention pertains to organometallic sandwich and half-sandwich tin (bearing $\eta^5$-$C_5$—Sn $\pi$ bond, five carbon atoms simultaneously bonded to tin atom together) compounds as EUV photoresists, and/or as the precursors for EUV lithography. The present invention is to provide preparation and purification methodology of organometallic sandwich and half-sandwich tin (bearing $\eta^5$-$C_5$—Sn $\pi$ bond) compounds with high purity suitable for EUV lithography (e.g. <7 nm). The present invention is further to provide an alternative EUV photoresist with higher resolution, sensitivity, and lower line width roughness without pattern collapse during microelectronic patterning. The sensitivity and stability of organometallic sandwich and half-sandwich tin (bearing $\eta^5$-$C_5$—Sn $\pi$ bond) compounds are important for high resolution and efficiency of photoresist for EUV lithography.

In another aspect, the described organometallic sandwich and half-sandwich tin (bearing $\eta^5$-$C_5$—Sn $\pi$ bond) compounds comprise $\eta^5$-cyclopentadienyl ($\eta^5$-$C_5H_5$, or Cp), or substituted $\eta^5$-cyclopentadienyl ($\eta^5$-$C_5H_4R$, $\eta^5$-$C_5H_3R_2$, $\eta^5$-$C_5H_2R_3$, $\eta^5$-$C_5HR_4$, or $\eta^5$-$C_5R_5$), wherein R is H, an alkyl, alkenyl, alkynyl, or cycloalkyl group with 1 to 20 carbon atoms, and or an aryl group with 6-20 carbon atoms, including but not limited to, methyl, ethyl, isopropyl, tert-butyl, tert-amyl, sec-butyl, pentyl, hexyl, neopentyl, cyclohexyl, cyclopentyl, cyclobutyl, cyclopropyl, phenyl. For example, methylcyclopentadienyl ($\eta^5$-$C_5H_4Me$, or $\eta^5$-$CH_4Cp$), dimethylcyclopentadienyl ($\eta^5$-$C_5H_3Me_2$, or $\eta^5$-$C_5H_3Cp$), trimethylcyclopentaidenyl ($\eta^5$-$C_5H_2Me_3$, or $\eta^5$-$CH_2Cp$), tetramethylcyclopentadienyl ($\eta^5$-$C_5HMe_4$, or $\eta^5$-$C_5HCp$), and $\eta^5$-pentamethylcyclopentadienyl ($\eta^5$-$C_5Me_5$, or $\eta^5$-$Cp^*$).

In a further aspect, the present disclosure pertains to organometallic half-sandwich ($\eta^5$-cyclopentadienyl) tin hydroxide oxide (bearing $\eta^5$-$C_5$—Sn $\pi$ bond) represented by the chemical formula $(\eta^5$-$C_5R_5)_2SnO(OH)$, and ($\eta^5$-cyclopentadienyl) tin tri (hydroxide) (bearing $\eta^5$-$C_5$—Sn $\pi$ bond) represented by the chemical formula $(\eta^5$-$C_5R_5)Sn(OH)_3$, wherein R is H, an alkyl (linear of branched), alkenyl, alkynyl, and or cycloalkyl group with 1 to 20 carbon atoms, and or an aryl group with 6-20 carbon atoms, including but not limited to, methyl, ethyl, isopropyl, tert-butyl, tert-amyl, sec-butyl, pentyl, hexyl, neopentyl, cyclohexyl, cyclopentyl, cyclobutyl, cyclopropyl.

In other aspects, the invention pertains to a method to prepare organometallic half-sandwich (cyclopentadienyl) tin hydroxide oxide (bearing $\eta^5$-$C_5$—Sn $\pi$ bond) represented by the chemical formula $(\eta^5$-$C_5R_5)_2SnO(OH)$, the method comprising the hydrolysis of (cyclopentadienyl) tin ($\eta^5$-$C_5H_5)SnCl_3$ with aqueous base solution like ammonium hydroxide solution or sodium hydroxide (NaOH) solution under ambient conditions like under inert atmosphere ($N_2$ or Ar) with standard Schlenk techniques.

In other aspects, the invention pertains to a method to prepare organometallic half-sandwich (cyclopentadienyl) tin hydroxide oxide (bearing $\eta^5$-$C_5$—Sn $\pi$ bond) represented by the chemical formula $(\eta^5$-$C_5R_5)_2SnO(OH)$, the method comprising the hydrolysis of (cyclopentadienyl) tin ($\eta^5$-$C_5H_5) SnCl_3$ with aqueous base solution like ammonium hydroxide solution or sodium hydroxide (NaOH) solution under ambient conditions like under inert atmosphere ($N_2$ or Ar) with standard Schlenk techniques.

In another aspect, the invention pertains to a method to prepare half-sandwich ($\eta^5$-cyclopentadienyl) tin tri (hydroxide) (bearing $\eta^5$-$C_5$—Sn $\pi$ bond) represented by the chemical formula $(\eta^5$-$C_5R_5)Sn(OH)_3$, the method comprising the reactions of $(\eta^5$-$C_5H_5) SnCl_3$ with water and/or in the presence of base like triethylamine ($Et_3N$) in organic solvent under ambient conditions like under inert atmosphere ($N_2$ or Ar) with standard Schlenk techniques.

Furthermore, the present invention pertains to the methods for purification of organometallic sandwich and half-sandwich tin (bearing $\eta^5$-$C_5$—Sn π bond) compounds. The purification methods include distillation, extraction, filtration, recrystallization, column chromatography, coordination and sublimation, and/or combination thereof.

In a further aspect, a solution composition of organometallic tin compounds EUV photoresist comprises one or more organometallic sandwich and half-sandwich tin (bearing $\eta^5$-$C_5$—Sn π bond) compounds, solvents, and/or additives.

The organic solvent comprises, including but not limited to, chloroform, dichloromethane, hexane, cyclohexane, tetrahydrofuran, dimethoxyethane, dimethylformamide, dimethyl sulfoxide, alcohols (e.g., methanol, ethanol, propanol, isopropanol, 1-butanol, 4-methyl-2-propanol, 4-methyl-2-pentenol), aromatic solvents (e.g., benzene, toluene, xylene), carboxylic acid, ethers (e.g., anisole, diethyl ether), esters (e.g., ethyl acetate, ethyl lactate, butyl acetate, propylene glycol monomethyl ether acetate), ketone (e.g., acetone, 2-heptanone, methyl ethyl ketone, acetone), or two or more mixtures thereof, and/or the like, but is not limited thereto.

BRIEF DESCRIPTION OF THE DRAWINGS

FIG. 1-27 are chemical formulas of organometallic sandwich and half-sandwich tin (bearing $\eta^5$-$C_5$—Sn π bond) compounds, wherein sandwich and half-sandwich comprise cyclopentadienyl, or substituted cyclopentadienyl ($\eta^5$-$C_5HAR$, $\eta^5$-$C_5H_3R_2$, $\eta^5$-$C_5H_2R_3$, $\eta^5$-$C_5HR_4$, and $\eta^5$-$C_5R_5$), R can be H, an alkyl, alkenyl, alkynyl, or cycloalkyl group with 1 to 20 carbon atoms, or an aryl group with 6-20 carbon atoms, for example, methylcyclopentadienyl ($\eta^5$-$C_5H_4Me$ or $\eta^5$-MeCp), dimethylcyclopentadienyl ($\eta^5$-$C_5H_3Me_2$ or $\eta^5$-$Me_2Cp$), trimethylcyclopentaidienyl ($\eta^5$-$C_5H_2Me_3$ or $\eta^5$-$Me_3Cp$), tetramethylcyclopentadienyl (15-$C_5HMe_4$ or $\eta^5$-$Me_4Cp$), $\eta^5$-pentamethylcyclopentadienyl ($\eta^5$-$C_5Me_5$ or $\eta^5$-Cp*), or other substituted cyclopentadienyl groups, including but not limited to, ethyl, propyl, butyl, pentyl, hexyl, phenyl group. The organometallic sandwich and half-sandwich tin (bearing $\eta^5$-$C_5$—Sn π bond) compounds are suitable for EUV photoresists, and/or as the precursors for EUV lithography.

DETAILED DESCRIPTION OF THE INVENTION

The present disclosure relates to organometallic sandwich and half-sandwich tin (bearing $\eta^5$-$C_5$—Sn π bond) compounds, which are suitable for EUV photoresists, and/or as the precursors for EUV lithography. The present invention discloses organometallic half-sandwich ($\eta^5$-cyclopentadienyl) tin hydroxide oxide represented by the chemical formula ($\eta^5$-$C_5R_5$)$_2$SnO(OH), and ($\eta^5$-cyclopentadienyl) tin tri (hydroxide) represented by the chemical formula ($\eta^5$-$C_5R_5$)Sn(OH)$_3$, including the methods for preparation and purification.

As described herein, the singular forms "a", "an", "one", and "the" are intended to include the plural forms as well, unless clearly indicated otherwise. Further, the expression "one of," "at least one of," "any", and "selected from," when preceding a list of elements, modify the entire list of elements and do not modify the individual elements of the list.

As described herein, the terms "includes", "including", "comprise", "comprising", when used in this specification, specify the presence of the stated features, steps, operations, elements, components, but do not preclude the presence or addition of one or more other features, steps, operations, elements, components, and/or group thereof.

As described herein, the term "and/or" includes any and all combinations of one or more of the associated listed items. Further, the use of "may" when describing embodiments of the present disclosure refers to "one or more embodiments of the present disclosure".

As described herein, the terms "use," "using," and "used" may be considered synonymous with the terms "utilize," "utilized", "applied", respectively. In addition, the terms "about," "only," and similar terms are used as terms of approximation and not as terms of degree, and are intended to account for the inherent deviation in measured or calculated values that would be recognized by those of ordinary skill in the art.

The term "alkyl" or "alkyl group" refers to a saturated linear or branched-chain hydrocarbon of 1 to 20 carbon atoms. The term "alkenyl, alkynyl, cycloalkyl" refers to hydrocarbon of 1 to 20 carbon atoms. The term "aryl" refers to aromatic group with 6-20 carbon atoms.

EUV lithography is under the development for the mass production of next generation <7 nm node. EUV photoresists are required to achieve higher performance, higher sensitivity and resolution, and cost reduction.

EUV light has been applied for photolithography at about 13.5 nm. The EUV light can be generated from Sn plasma or Xe plasma source excited using high energy lasers or discharge pulses.

Organometallic photoresists are used in EUV lithography because metals have high adsorption capacity of EUV radiation. Radiation sensitivity and thermal-, oxygen- and moisture-stability are important for organometallic photoresists. In some embodiments, organometallic photoresists may adsorb moisture and oxygen, which may result in decreasing stability, as well decreasing solubility in developer solutions. In addition, in some embodiments, photoresist layer may outgas volatile components prior to the radiation exposure and development operations, which may negatively affect the lithography performance, pattern collapse and increase defects.

In general, metal central of organometallic EUV photoresist plays the key role in determining the absorption of radiation. Tin has strong absorption of EUV light at 13.5 nm. The organic ligands bonded to tin atom may also has absorption of EUV light. The tuning and modification of organic ligands can change the sensitivity, resolution and radiation absorption, and the desired control of the material properties.

Organometallic tin photoresist layer is patterned by exposure to actinic radiation. Typically, the chemical properties of the photoresist regions struck by incident radiation change in a manner that depends on the type of photoresist used. Photoresist can be positive resist or negative resist. In some embodiments, positive resist refer to a photoresist material that when exposed to radiation (e.g., EUV) becomes soluble in a developer, while the region of the photoresist that is non-exposed (or exposed less) is insoluble in the developer. In some embodiments, on the contrary, negative resist refers to a photoresist material that when exposed to radiation becomes insoluble in the developer, while the region of the photoresist that is non-exposed (or exposed less) is soluble in the developer.

The organometallic tin compounds possess excellent properties as photoresists for the application in EUV lithographic patterning. Suitable organometallic tin photoresists are described in U.S. Patents and Patent Applications. These US. Patents and Patent Applications described carbon atom of aliphatic and aromatic groups bonded to tin atom as single bond $\eta^1$-$C_1$—Sn (one carbon atom of an organic ligand bonded to one tin atom), for example, t-BuSn $(NMe_2)_3$ and t-BuSn $(O$-t-$Bu)_3$.

The organometallic sandwich and half-sandwich tin (bearing $\eta^5$-$C_5$—Sn π bond, five carbon atoms of $\eta^5$-cyclopentadienyl group simultaneously bonded to one tin atom together) compounds represented by Chemical Formulas FIG. 1-27 contain tin atom, which may have strong adsorption of EUV light at about 13.5 nm and thus may have excellent (or suitable) sensitivity to EUV light, and can be used as radiation sensitive organotin EUV photoresists, and/or as the precursors for the preparation of organotin EUV photoresists and photolithography patterning.

In the Chemical Formulas FIG. 1-27, R is H, an alkyl, alkenyl, alkynyl, or cycloalkyl group with 1 to 20 carbon atoms, or an aryl group with 6-20 carbon atoms, and $R^1$, $R^2$, $R^3$ are independently H, alkyl (linear or branched), alkenyl, alkynyl, or cycloalkyl group with 1 to 20 carbon atoms, or aryl group with 6-20 carbon atoms. Sandwich and half-sandwich comprise cyclopentadienyl ($\eta^5$-$C_5H_5$, or Cp), substituted cyclopentadienyl ($\eta^5$-$C_5HAR$, $\eta^5$-$C_5H_3R_2$, $\eta^5$-$C_5H_2R_3$, $\eta^5$-$C_5HR_4$, or $\eta^5$-$C_5R_5$), for example, methylcyclopentadienyl ($\eta^5$-$C_5H_4Me$ or $\eta^5$-MeCp), dimethylcyclopentadienyl ($\eta^5$-$C_5H_3Me_2$ or $\eta^5$-$Me_2Cp$), trimethylcyclopentaidenyl ($\eta^5$-$C_5H_2Me_3$ or $\eta^5$-$Me_3Cp$), tetramethylcyclopentadienyl ($\eta^5$-$C_5HMe_4$ or $\eta^5$-$Me_4Cp$), pentamethylcyclopentadienyl (n-$C_5Me_5$ or $\eta^5$-Cp*), or other alkyl/aryl substituted cyclopentadienyl groups, including, but not limited to, methyl, ethyl, propyl, butyl, pentyl, hexyl, phenyl.

The organometallic sandwich and half-sandwich tin (bearing $\eta^5$-$C_5$—Sn π bond) compounds contain $\eta^5$-cyclopentadiene-Sn bond ($\eta^5$-$C_5$—Sn bond, five carbon atoms of $\eta^5$-cyclopentadienyl ligand simultaneously bonded to one tin atom), such as ($\eta^5$-$C_5H_5)_2Sn(O'Bu)_2$. It bonded $\eta^5$-$C_5$—Sn is sensitive to UV light, which has been demonstrated, for example, P.J. Baker, A.G. Davies, M.-W. Tse, "The Photolysis of Cyclopentadienyl Compounds of Tin and Mercury. Electron Spin Resonance Spectra and Electronic Configuration of the Cyclopentadienyl, Deuteriocyclopentadienyl, and Alkylcyclopentadienyl Radicals", Journal of Chemical Society, Perkin II, 1980, 941-948; S.G. Baxter, A.H. Cowley, J.G. Lasch, M. Lattman, W.P. Sharum, C.A. Stewart, "Electronic Structures of Bent-Sandwich Compounds of the Main-Group Elements: A Molecular Orbital and UV Photoelectron Spectroscopic Study of Bis(cyclopentadienyl) tin and Related Compounds", Journal of the American Chemical Society, 1982, 104, 4064-4069, all of which are incorporated herein by reference.

($\eta^5$-$C_5R_5$) of the Chemical Formulas FIG. 1-27 may impart photosensitivity to the compounds, and the $\eta^5$-$C_5$—Sn π bond formed may promote suitable solubility in an organic solvent to the organometallic sandwich and half-sandwich tin compounds. Accordingly, these $\eta^5$-$C_5$—Sn π bond containing organometallic sandwich and half-sandwich tin compounds according to an embodiment may have improved sensitivity, resolution and stability, and may suitable for EUV photoresists, and/or as the precursors for EUV lithography to form tin oxide or tin oxide hydroxide film.

The organometallic sandwich and half-sandwich tin (bearing $\eta^5$-$C_5$—Sn π bond) compounds as EUV photoresists may have excellent sensitivity and resolution, lower line edge and width roughness.

As one of ordinary skill in the art will recognize, the chemical compounds listed here are merely intended as illustrated examples of the organometallic sandwich and half-sandwich tin (bearing $\eta^5$-$C_5$—Sn π bond) compounds, and are not intended to limit the embodiments to only those organometallic sandwich and half-sandwich tin (bearing $\eta^5$-$C_5$—Sn π bond) compounds specifically described. Rather, any suitable organometallic sandwich and half-sandwich tin (bearing $\eta^5$-$C_5$—Sn π bond) compounds may be used, and all such organometallic sandwich and half-sandwich tin (bearing $\eta^5$-$C_5$—Sn π bond) compounds are fully intended to be included within the scope of the present embodiments.

The organometallic sandwich and half-sandwich tin (bearing $\eta^5$-$C_5$—Sn π bond) compounds are di(cyclopentadienyl) tin ($\eta^5$-$C_5R_5$) Sn based represented by chemical formulas FIG. 1-10, and (cyclopentadienyl) tin ($\eta^5$-$C_5R_5$) Sn based represented by the Chemical Formulas FIG. 11-27. Cyclopentadienyl represents cyclopentadienyl, and substituted cyclopentadienyl ($\eta^5$-$C_5HAR$, $\eta^5$-$C_5H_3R_2$, $\eta^5$-$C_5H_2R_3$, $\eta^5$-$C_5HR_4$, or $\eta^5$-$C_5R_5$ group), R can be H, an alkyl, alkenyl, alkynyl, or cycloalkyl group with 1 to 20 carbon atoms or an aryl group with 6-20 carbon atoms, including but not limited to, methyl, ethyl, propyl, butyl, hexyl, phenyl group.

In the present disclosure, the term "substituted" refers to replacement of a hydrogen atom with a C1 to C20 alkyl group, a C1 to C20 alkene group, a C1 to C20 alkyne group, a C1 to C20 cycloalkyl group, a C6 to C20 aryl group, or other relevant groups.

In the present disclosure, the organometallic sandwich and half-sandwich tin (bearing $\eta^5$-$C_5$—Sn π bond) compounds include ($\eta^5$-cyclopentadienyl) tin hydroxide oxide and ($\eta^5$-cyclopentadienyl) tin tri (hydroxide), and the preparation and purification methods with high purity for microelectronic EUV lithography patterning.

One or more examples embodiments of the present disclosure provide a semiconductor EUV photoresist composition according to an embodiment as hereinafter described.

A semiconductor EUV photoresist composition according to an embodiment of the present disclosure includes (e.g., consist of) organometallic sandwich and half-sandwich tin (bearing $\eta^5$-$C_5$—Sn π bond) compounds represented by Chemical Formulas FIG. 1-27.

In an embodiment, the organometallic sandwich and half-sandwich tin (bearing $\eta^5$-$C_5$—Sn π bond) compounds according to the embodiments of the present disclosure may be represented by at least one of Chemical Formulas FIGS. 1 to 27.

The organometallic sandwich and half-sandwich tin (bearing $\eta^5$-$C_5$—Sn π bond) compound photoresist composition according to embodiments of the present disclosure may have relatively improved photosensitivity, resolution, and etch resistance, wherein $\eta^5$-cyclopentadienyl ($\eta^5$-$C_5$, or $\eta^5$-Cp) or substituted $\eta^5$-cyclopentadienyl, oxygen or various other groups are bonded to tin atom.

The organometallic sandwich and half-sandwich tin (bearing $\eta^5$-$C_5$—Sn π bond) compounds, represented by the Chemical Formulas FIG. 1-27, are soluble in appropriate organic solvents for further pattern processing. The solution composition of organometallic sandwich and half-sandwich tin (bearing $\eta^5$-$C_5$—Sn π bond) compound photoresist can be formed by dissolving the relevant compound in organic solvents, include, but not limit to, chloroform, dichloromethane, hexane, cyclohexane, tetrahydrofuran (THF), dimethoxyethane (DME), dimethylformamide (DMF), dimethyl sulfoxide (DMSO), alcohols (e.g., methanol, ethanol, propanol, butanol, 4-methyl-2-propanol, 4-methyl-2-pentenol), aromatic solvents (e.g., benzene, toluene, xylene), carboxylic acid, ethers (e.g. diethyl ether, anisole), esters (e.g. ethyl acetate, ethyl lactate, butyl acetate, propylene glycol monomethyl ether acetate), ketone (e.g., acetone, 2-heptanone, 4-methyl-2-pentanone, methyl ethyl ketone), or two or more mixtures thereof, and/or the like, but is not limited thereto. The solution compositions of organometallic sandwich and half-sandwich tin (bearing $\eta^5$-$C_5$—Sn $\pi$ bond) compounds can be utilized as photoresists for further processing and lithography patterning. A person of ordinary skills in the art will recognize that the choice of solvents and solution composition components within the explicit ranges of above are contemplated and are within the present disclosure.

The solubility of organometallic sandwich and half-sandwich tin (bearing $\eta^5$-$C_5$—Sn $\pi$ bond) compounds in organic solvents may be improved during an EUV exposure. Accordingly, a nanoscale pattern having improved sensitivity and resolution may be afforded by using organometallic sandwich and half-sandwich tin (bearing $\eta^5$-$C_5$—Sn $\pi$ bond) compounds. Additionally, the as-formed pattern by using of organometallic sandwich and half-sandwich tin (bearing $\eta^5$-$C_5$—Sn $\pi$ bond) compounds may not collapse while having a high aspect ratio.

In some embodiments, the organometallic sandwich and half-sandwich tin (bearing $\eta^5$-$C_5$—Sn $\pi$ bond) compounds comprising a hydrolyzed group can be used as the precursor compositions to form organotin oxo-hydroxo patterning composition by water or other suitable reagents under appropriate conditions. For example, the half-sandwich organotin hydroxide oxide can be represented by the chemical formula $(\eta^5$-$C_5R_5)$SnO(OH) ($\eta^5$-$C_5R_5$=$C_5H_5$, or other substituted cyclopentadienyls). The hydrolyzed groups can be alkoxide, ester, amide, halogen, but not limited to.

The organometallic sandwich and half-sandwich tin (bearing $\eta^5$-$C_5$—Sn $\pi$ bond) compounds photoresist may have high sensitivity (low expose dose, e.g. <20 mJ/cm$^2$) and excellent performance; low or free pattern defectivity at nanoscale. The organometallic sandwich and half-sandwich tin (bearing $\eta^5$-$C_5$—Sn $\pi$ bond) compounds photoresist may have tight pitch (e.g. <10 nm), and may sustain the yield and deliver high resolution.

In an embodiment, organometallic half-sandwich ($\eta^5$-cyclopentadienyl) tin hydroxide oxide (bearing $\eta^5$-$C_5$—Sn $\pi$ bond) is represented by the chemical formula $(15$-$C_5R_5)_2$SnO(OH), and (cyclopentadienyl) tin tri (hydroxide) is represented by the chemical formula $(\eta^5$-$C_5R_5)$Sn(OH)$_3$, wherein R is H, an alkyl, alkenyl, alkynyl, or cycloalkyl group with 1 to 20 carbon atoms, or an aryl group with 6-20 carbon atoms.

Examples of specific organometallic sandwich and half-sandwich tin (bearing $\eta^5$-$C_5$—Sn $\pi$ bond) compounds that may be used in implementations of the invention including $(\eta^5$-$C_5R_5)$SnO(OH) and $(\eta^5$-$C_5R_5)$Sn(OH)$_3$, wherein R is H, an alkyl, alkenyl, alkynyl, or cycloalkyl group with 1 to 20 carbon atoms, or an aryl group with 6-20 carbon atoms.

All chemical manipulations, including preparation and purification, are performed under an inert atmosphere of purified nitrogen or argon in dry and degassed solvents by employing standard Schlenk techniques. The methods for purification of organometallic sandwich and half-sandwich tin (bearing $\eta^5$-$C_5$—Sn $\pi$ bond) compounds comprise distillation, extraction, filtration, recrystallization, column chromatography, coordination and sublimation, and combinations thereof.

In some embodiments, organometallic half-sandwich (cyclopentadienyl) tin hydroxide oxide (bearing $\eta^5$-$C_5$—Sn $\pi$ bond) represented by the chemical formula $(\eta^5$-$C_5R_5)$SnO(OH), is prepared from the hydrolysis reactions of (cyclopentadienyl) tin trichloride with aqueous base solution like aqueous ammonium hydroxide or NaOH solution under ambient conditions like standard Schlenk techniques, wherein R is H, an alkyl, alkenyl, alkynyl, or cycloalkyl group with 1 to 20 carbon atoms, or an aryl group with 6-20 carbon atoms. A person of ordinary skills in the art will recognize that additional bases and reaction conditions within the explicit ranges of above are contemplated and are within the present disclosure.

In some embodiments, organometallic half-sandwich (cyclopentadienyl)tin tri (hydroxide) (bearing $\eta^5$-$C_5$—Sn $\pi$ bond) represented by the chemical formula $(\eta^5$-$C_5R_5)$Sn(OH)$_3$, is prepared from the hydrolysis reactions of (cyclopentadienyl) tin trichloride with water and/or in the presence of base like triethylamine under ambient conditions like standard Schlenk techniques, wherein R is H, an alkyl, alkenyl, alkynyl, or cycloalkyl group with 1 to 20 carbon atoms, or an aryl group with 6-20 carbon atoms. A person of ordinary skills in the art will recognize that additional bases and reaction conditions within the explicit ranges of above are contemplated and are within the present disclosure.

Organometallic sandwich and half-sandwich tin (bearing $\eta^5$-$C_5$—Sn $\pi$ bond) compound impurities may result in contamination and defect for EUV photolithography. In some embodiments, the impurities can be partial hydrolysis or other condensation side products, for example, but not limited to, $(\eta^5$-$C_5R_5)$Sn(OH)$X_2$, $(\eta^5$-$C_5R_5)$Sn(OH)$_2$X, X=F, Cl, Br, I.

In one or more embodiments, the semiconductor EUV photoresists composition according to an embodiment may include one or more organometallic sandwich and half-sandwich tin (bearing $\eta^5$-$C_5$—Sn $\pi$ bond) compounds, a solvent, and/or an additive.

In general, the organic solvents selection can be determined by solubility, boiling point, reactivity, volatility, viscosity, flammability, and toxicity. The potential hydration and/or condensation may occur after organometallic tin compounds photoresists dissolve in organic solvent, and the characters of the species may change as a result of partial hydration and condensation, especially during the coating process. When the composition of the solution is references herein, the reference is to the component as added to the solution, since complex formulation may produce metal polynuclear species, and/or metal-containing nanoclusters in solution that may not be well characterized.

In some embodiments, the organometallic sandwich and half-sandwich tin (bearing $\eta^5$-$C_5$—Sn $\pi$ bond) compounds, represented by the Chemical Formulas FIG. 1-27, may be used as the precursors to form tin-containing nanoclusters for EUV photolithography. In some embodiments, two or more organometallic tin compounds are used thereof.

The solvent of the organometallic tin photoresists composition according to the embodiment may be an organic solvent, and in some embodiments, may include, chloroform, dichloromethane, hexane, cyclohexane, tetrahydrofuran, dimethoxyethane, dimethylformamide, dimethyl sulfoxide, alcohols (e.g., methanol, ethanol, propanol, butanol, 4-methyl-2-propanol, 4-methyl-2-pentenol), aromatic solvents (e.g., benzene, toluene, xylene), carboxylic acid, ethers (e.g. diethyl ether, anisole), esters (e.g. ethyl acetate, ethyl lactate, butyl acetate, propylene glycol monomethyl ether acetate), ketone (e.g., acetone, 2-heptanone, 4-methyl-2-pentanone, methyl ethyl ketone), or two or more mixtures thereof, and/or the like, but is not limited thereto.

In some embodiments, the organometallic sandwich and half-sandwich tin (bearing $\eta^5$-$C_5$—Sn $\pi$ bond) compounds photoresist composition may also contain an additive, besides organometallic tin compound and solvent.

In some embodiments, the additive can be used to purify the impurities of trace metals or metallic complexes by-products. In some embodiments, the additives consist of molecular chelating agents, including but not limited to phosphine ligand, amines, polyamines, alcohol amines, amino acids, biomolecules, e.g. ethylenediamine-tetra acetic acid (EDTA), chitosan, cellulose, glycol, but not limited to.

In some embodiments, the additive can be a resin. The resin may be organic polymer, or small organic aromatic molecules. In some embodiments, the additive can be a surfactant. In some embodiments, the additive can be a water adsorbent, such as glycol, but not limited to. In some embodiments, the additive can be an adhesion additive, such as a silane. In some embodiments, the additive can be a protective polymer, such as a fluorinated polymer.

The organometallic sandwich and half-sandwich tin (bearing $\eta^5$-$C_5$—Sn $\pi$ bond) compounds absorb EUV radiation after exposed to EUV, sandwich ligand and one or more $R_1$, $R_2$, $R_3$ group are cleaved from the organometallic sandwich and half-sandwich tin (bearing $\eta^5$-$C_5$—Sn $\pi$ bond) compounds to form tin oxide or tin oxide hydroxide pattern. In some embodiments, the unexposed area of the substrate surface may be removed by the developer.

Additionally, the organometallic sandwich and half-sandwich tin (bearing $\eta^5$-$C_5$—Sn $\pi$ bond) compounds photoresist pattern according to an embodiment is not necessarily limited to the negative tone image but may be formed to have a positive tone image.

In some embodiments, the developer compositions for as-formed patters can be any suitable organic solvent, or aqueous solution, at low to high concentrations. In some embodiments, non-limiting examples of the organic solvent used in the method of forming patterns, the organic solvent can be one or more selected from, but not limited to, for example, chloroform, dichloromethane, hexane, cyclohexane, tetrahydrofuran, dimethoxyethane, dimethylformamide, dimethyl sulfoxide, ethyl lactate, n-butyl acetate, dioxane, ketones (e.g., acetone, 2-heptanone, methylethylketone, cyclohexanone, γ-butyrolactone, and/or the like), alcohols (e.g., methanol, ethanol, 1-propanol, isopropanol, 1-butanol, 4-methyl-2-propanol, 1-ethoxy-2-propanol, methyl isobutyl carbinol, and/or the like), carboxylic acid, ethers (e.g., anisole, diethyl ether, propylene glycol monomethyl ether, and/or the like), esters (e.g., ethyl acetate, n-butyl acetate, butyrolactone, propylene glycol monomethyl ester acetate, and/or the like), aromatic solvents (e.g. benzene, toluene, xylene, and/or the like), and combinations thereof.

Hereinafter, the present invention is described in more details through Examples regarding to the preparation of the organometallic sandwich and half-sandwich tin (bearing $\eta^5$-$C_5$—Sn $\pi$ bond) compounds photoresist of the present embodiments. However, the present invention is not limited by the Examples. The following examples are provided for further illustration of certain embodiments of the disclosure, which is not necessarily limited to these embodiments.

EXAMPLES

Example 1

Synthesis of ($\eta^5$-$C_5H_5$)SnCl$_3$

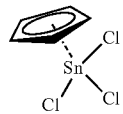

This example and the followings provide the solid evidences for the synthesis of organometallic tin complexes. The Schlenk lines with stand techniques like dried organic solvents under dried inert dinitrogen or argon atmosphere are utilized for the synthesis of organometallic tin compounds.

($\eta^5$-$C_5H_5$) SnCl$_3$ was prepared by the reaction of equivalent $C_5H_5Na$ or $C_5H_5Li$ with equivalent SnCl$_4$ (Caution: SnCl$_4$ is extremely hydrolytic when exposure to air or water and releasing HCl gaseous!!!) under ambient condition like in hexane, diethyl ether or benzene at −78° C., which was according to the references: U. Schroer, H.-J. Albert, and W. P. Neumann, Journal of Organometallic Chemistry, 1975, 102, 291-295. $C_5H_5Na$ was prepared from the reaction of freshly cracked $C_5H_6$ with sodium sand in THF at 0° C. with vigorous stirring, and then the mixture was slowly warmed to room temperature until all the solid sodium sand disappeared. Then the obtained solution was decanted carefully for the following usage without further purification.

The solution of $C_5H_5Na$ in THF (in 1:1 molecular ratio) was added dropwise in 2 hours to the solution of SnCl$_4$ in hexane at −78° C. with vigorous stirring. Then the mixture was slowly warmed to room temperature and stirred overnight. After evaporated all the volatiles, the residue was extracted by dried diethyl ether and filtered through Celite. The filtration was evaporated in vacuum to afford ($\eta^5$-$C_5H_5$) SnCl$_3$ as yellow oil. The purification was carried out by vacuum fractional distillation.

Example 2

Synthesis of ($\eta^5$-$C_5H_5$)SnO(OH)

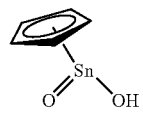

This example presents the formation of ($\eta^5$-$C_5H_5$)SnO(OH) by the hydrolysis of ($\eta^5$-$C_5H_5$) SnCl$_3$ with aqueous ammonium hydroxide or NaOH solution.

Under nitrogen atmosphere, deoxygenized aqueous ammonium hydroxide solution (100 mL) was added to ($\eta^5$-$C_5H_5$) SnCl$_3$ (2.90 g, 10 mmol) at room temperature with vigorous stirring. After stirred for 2 hours, the obtained precipitate was filtered and washed with DI water (3×10 mL). The solid was dried in vacuum overnight to afford the product ($\eta^5$-$C_5H_5$)SnO(OH) (1.08 g, yield 50%), which was characterized by 1H NMR and electron ionization mass

Example 3

Synthesis of ($\eta^5$-C$_5$H$_5$)Sn(OH)$_3$

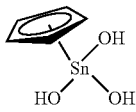

This example presents the preparation of ($\eta^5$-C$_5$H$_5$)Sn(OH)$_3$ through the hydrolysis of ($\eta^5$-C$_5$H$_5$)SnCl$_3$ with water and/or in the presence of base like triethylamine.

Under nitrogen atmosphere, to the solution of ($\eta^5$-C$_5$H$_5$)SnCl$_3$ (2.9 g, 10 mmol) in tetrahydrofuran (100 ml) at 0° C., water (1 mL, 55.6 mmol) was added with vigorous stirring, followed by addition of freshly distilled triethylamine (3.7 ml, 36 mmol). The mixture were then warmed to room temperature and stirred for one hour. After evaporated all the volatiles under vacuum, the residue was extracted by toluene and then filtered through Celite. The filtrate was evaporated in vacuo to afford ($\eta^5$-C$_5$H$_5$)Sn(OH)$_3$ (1.66 g, yield 71%). The product was characterized by 1H NMR and electron ionization mass spectra. 1H NMR (298 K, 400.13 MHZ, C$_6$D$_6$)$_{\delta=5.93}$ (s, 5H, C$_5$H$_5$). MS (EI): m/z 235 (M+).

It is understood that the above-described examples and embodiments are intend to be illustrative purpose only. It should be apparent that the present invention has described with references to particular embodiments, and is not limited to the example embodiment as described, and may be variously modified and transformed. A person with ordinary skill in the art will recognize that changes can be made in form and detail without departing from the spirit and scope of this invention. Accordingly, the modified or transformed example embodiments as such may be understood from the technical ideas and aspects of the present invention, and the modified example embodiments are thus within the scope of the appended claims of the present invention and equivalents thereof.

What is claimed is:

1. Organometallic half-sandwich ($\eta^5$-cyclopentadienyl) tin hydroxide oxide represented by the chemical formula ($\eta^5$-C$_5$R$_5$)SnO(OH), wherein R is selected from the group consisting of H, linear or branched alkyl, alkenyl, alkynyl and a cycloalkyl group, each with 1 to 20 carbon atoms, or R is an aryl group, with 6-20 carbon atoms.

2. Organometallic half-sandwich tin compounds of claim 1 wherein the $\eta^5$-C$_5$R$_5$ is selected from the group consisting of $\eta^5$-C$_5$H$_5$, 15-C$_5$H$_4$R, 15-C$_5$H$_3$R$_2$, $\eta^5$-C$_5$H$_2$R$_3$, $\eta^5$-C$_5$HR$_4$; and $\eta^5$-C$_5$R$_5$.

3. A composition comprising the organometallic half-sandwich ($\eta^5$-cyclopentadienyl)tin hydroxide oxide represented by the chemical formula ($\eta^5$-C$_5$R$_5$)SnO(OH) of claim 1 and a solvent and/or an additive.

* * * * *